(12) United States Patent
Matocha et al.

(10) Patent No.: US 7,595,241 B2
(45) Date of Patent: Sep. 29, 2009

(54) METHOD FOR FABRICATING SILICON CARBIDE VERTICAL MOSFET DEVICES

(75) Inventors: Kevin Sean Matocha, Rexford, NY (US); Jody Alan Fronheiser, Selkirk, NY (US); Larry Burton Rowland, Scotia, NY (US); Jesse Berkley Tucker, Niskayuna, NY (US); Stephen Daley Arthur, Glenville, NY (US); Zachary Matthew Stum, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 344 days.

(21) Appl. No.: 11/466,488

(22) Filed: Aug. 23, 2006

(65) Prior Publication Data

US 2008/0050876 A1   Feb. 28, 2008

(51) Int. Cl.
*H01L 21/336* (2006.01)

(52) U.S. Cl. .................. 438/268; 438/269; 438/273; 257/328; 257/329; 257/E29.257

(58) Field of Classification Search ................ 257/327, 257/328, 492, 493, E29.256, E29.257, 329; 438/212, 269, 268, 273
See application file for complete search history.

(56) References Cited

U.S. PATENT DOCUMENTS

| | | | |
|---|---|---|---|
| 5,318,915 A | 6/1994 | Baliga et al. | |
| 5,322,802 A | 6/1994 | Baliga et al. | |
| 5,625,216 A * | 4/1997 | Miller | 257/387 |
| 5,705,406 A | 1/1998 | Rottner et al. | |
| 6,144,067 A * | 11/2000 | Kinzer | 257/335 |
| 6,313,482 B1 | 11/2001 | Baliga | |
| 6,750,524 B2 | 6/2004 | Parthasarthy et al. | |
| 6,853,006 B2 | 2/2005 | Kataoka et al. | |
| 7,042,046 B2 | 5/2006 | Onishi et al. | |

(Continued)

FOREIGN PATENT DOCUMENTS

EP    0627761    11/2001

(Continued)

OTHER PUBLICATIONS

"High Voltage Thin Layer Devices (Resurf Devices)" Appels, J.A.; Vaes, H. M. J.; Philips Research Laboratories, Eindhoven, The Netherlands; 1979 IEEE; pp. 238-244.

(Continued)

*Primary Examiner*—Thanh V Pham
*Assistant Examiner*—Maria Ligai
(74) *Attorney, Agent, or Firm*—Richard D. Emery

(57) ABSTRACT

A method of forming a vertical MOSFET device includes forming a trench within a drift layer substrate, the drift layer comprising a first polarity type, the trench generally defining a well region of a second polarity type opposite the first polarity type. An ohmic contact layer is formed within a bottom surface of the trench, the ohmic contact layer comprising a material of the second polarity type. A layer of the second polarity type is epitaxially grown over the drift layer, sidewall surfaces of the trench, and the ohmic contact layer. A layer of the first polarity type is epitaxially grown over the epitaxially grown layer of the second polarity type so as to refill the trench, and the epitaxially grown layers of the first and second polarity type are planarized so as to expose an upper surface of the drift layer substrate.

19 Claims, 24 Drawing Sheets

U.S. PATENT DOCUMENTS

| | | | |
|---|---|---|---|
| 2004/0124435 | A1* | 7/2004 | D'Evelyn et al. ............ 257/103 |
| 2006/0071217 | A1* | 4/2006 | Ohyanagi et al. ............. 257/77 |
| 2006/0097267 | A1 | 5/2006 | Kumar et al. |
| 2006/0131644 | A1 | 6/2006 | Saito et al. |

OTHER PUBLICATIONS

Proceedings of 1998 International Symposium on Power Semiconductor Devices & ICs, Kyoto. "Simulated Superior Performances of Semiconductor Superjunction Devices" Fujihira, Tatsuhiko; Miyasaka, Yasushi. pp. 423-426.

1999 IEEE. "COOLMOS™—a new milestone in high voltage Power MOS" Lorenz, L.; Deboy, G.; Knapp, A.; Marz, M. pp. 3-10.

Journal of Electronic Materials, vol. 31, No. 5, 2002. "Stacking-Fault Formation and Propagation in 4H-SiC PiN Diodes" Stahlbush, R. E.; Fatemi, M.; Fedison, J. B.; Arthur, S.D.; Rowland, L. B.; Wang, S. pp. 370-375.

Institute of Physics Publishing. Semiconductor Science and Technology, vol. 17, Aug. 9, 2002. "Carrier mobility model for simulation of SiC-based electronics devices" Mnatsakanov, T. T.; Levinshtein, M. E.; Pomortseva, L. I.; Yurkov, S. N. pp. 974-977.

IEEE Transactions on Electron Devices, vol. 50, No. 3, Mar. 2003. "High Temperature SiC Trench Gate p-IGBTs" Singh, Ranbir; Ryu, Sei-Hyung; Capell, D. Craig; Palmour, John W. pp. 774-784.

IEEE Transactions on Electron Devices, vol. 51, No. 3, Mar. 2004. "On the Specific On-Resistance of High-Voltage and Power Devices" Zingg, Rene P. pp. 492-499.

Proceedings of the 17th International Symposium on Power Semiconductor Devices & IC's, May 23-26, 2005, Santa Barbara, CA. "Evolution of the 1600 V, 20 A, SiC Bipolar Junction Transistors" Agarwal, Anant K.; Krishnaswami, Sumi; Richmond, James; Capell, Craig; Ryu, Sei-Hyung; Palmour, John W.; Balachandran, Santosh; Chow, T. Paul; Bayne, Stephen; Geil, Bruce; Scozzie, Charles; Jones, Kenneth A.: pp. 1-3. 162.

* cited by examiner

METHOD FOR FABRICATING SILICON CARBIDE VERTICAL MOSFET DEVICES

BACKGROUND OF THE INVENTION

The invention relates generally to power semiconductor switching devices and, more particularly, to a method for forming silicon carbide vertical MOSFET devices having improved channel length uniformity for decreased channel resistance.

Silicon carbide (SiC) is a wide band gap material having a maximum breakdown electric field larger than that of silicon by about one order of magnitude. Thus, SiC has been considered as an advantageous material for use in the manufacture of next generation power semiconductor devices. Such devices include, for example, Schottky diodes, thyristors and vertical MOSFETs (metal oxide semiconductor field effect transistors).

Most power MOSFETs have a different structure than commonly known "lateral" MOSFETs, in that their electrical flow path is vertical and not planar. With a lateral structure, the current and breakdown voltage ratings of the MOSFET are both a function of the channel dimensions (respectively, the width and length of the channel), resulting in inefficient use of the device real estate. With a vertical structure, the voltage rating of the transistor is a function of the doping and thickness of the epitaxial layer, while the current rating is a function of the channel width and length. This makes it possible for the transistor to sustain both high blocking voltage and high current within a compact piece of semiconductor material.

In a conventionally formed vertical MOSFET (also referred to as a DMOSFET, or generally DMOS), selective area P-well regions are formed within a surface layer of a lightly doped N− drift layer (in an N-type device). In turn, selective area N+ source regions and more heavily doped P+ regions (for ohmic contact to the P-well) are formed within each P-well region to facilitate the vertical flow of drift current. A device channel length is thereby defined by the distance between the outer edges of the N+ source region and the outer edges of the P-well containing the N+ source region.

Because such regions within the drift layer are conventionally formed by dopant implantation using lithographically patterned masks, there is the potential for inconsistent channel lengths, as well as damage to the channel region due to the implantation steps themselves. These can, in turn, result in increased channel resistance. Moreover, the formation of multiple doped regions results in the use of several lithography mask levels, which increases device manufacturing costs and decreases throughput.

Accordingly, it would be desirable to be able to manufacture a SiC power switching device (e.g., DMOSFET) that provides a more uniform aligned channel with decreased resistance.

BRIEF DESCRIPTION OF THE INVENTION

The above and other drawbacks and deficiencies of the prior art may be overcome or alleviated by an embodiment of a method of forming a vertical MOSFET device, including forming a trench within a drift layer substrate, the drift layer comprising a first polarity type, the trench generally defining a well region of a second polarity type opposite the first polarity type. An ohmic contact layer is formed within a bottom surface of the trench, the ohmic contact layer comprising a material of the second polarity type. A layer of the second polarity type is epitaxially grown over the drift layer, sidewall surfaces of the trench, and the ohmic contact layer. A layer of the first polarity type is epitaxially grown over the epitaxially grown layer of the second polarity type so as to refill the trench, and the epitaxially grown layers of the first and second polarity type are planarized so as to expose an upper surface of the drift layer substrate.

In another embodiment, a method of forming a vertical MOSFET device includes forming a drift layer over a drain region substrate, the drift layer and drain region comprising a first polarity type with the drain having a greater dopant concentration with respect to the drift layer; forming a trench within the drift layer, the trench generally defining a well region of a second polarity type opposite the first polarity type; forming an ohmic contact layer within a bottom surface of the trench, the ohmic contact layer comprising a material of the second polarity type; epitaxially growing a well region layer of the second polarity type over the drift layer, sidewall surfaces of the trench, and the ohmic contact layer; epitaxially growing a source layer of the first polarity type over the well region layer so as to refill the trench; planarizing the epitaxially grown source layer and well region layers so as to expose an upper surface of the drift layer; forming a gate insulating layer over the upper surface of the drift layer, the well region layer and the source layer; forming a gate electrode contact over a portion of the gate insulating layer; and forming a source electrode contact within the source layer, the well region layer and the ohmic contact layer.

In still another embodiment, a method of forming a super-junction vertical MOSFET device includes forming a doped drain region substrate of a first conductivity type; forming a drift layer over the drain region substrate, the drift layer comprising the first conductivity type; forming a plurality of trenches within the drift layer, extending down to the top of the drain region substrate; and filling the plurality of trenches by epitaxial growth of a material of a second conductivity type opposite the first conductivity type.

In another embodiment, vertical MOSFET device includes a drift layer formed over a drain region substrate, the drift layer and drain region comprising a first polarity type with the drain having a greater dopant concentration with respect to the drift layer. An ohmic contact layer is formed within an upper region of the drift layer, the ohmic contact layer comprising a material of the second polarity type. A well region layer of the second polarity type is formed atop the ohmic contact layer, wherein the ohmic contact layer comprises a greater dopant concentration than the well region layer. A source layer of the first polarity type is formed within the well region layer, and a gate insulating layer is formed over an upper surface of the drift layer, the well region layer and the source layer. A gate electrode contact is formed over a portion of the gate insulating layer, and a source electrode contact is formed within the source layer, the well region layer and the ohmic contact layer.

These and other advantages and features will be more readily understood from the following detailed description of preferred embodiments of the invention that is provided in connection with the accompanying drawings.

DETAILED DESCRIPTION OF THE INVENTION

Embodiments of the invention disclosed herein include a method for forming silicon carbide vertical MOSFET devices having improved channel length uniformity for decreased channel resistance. Briefly stated, conventional dopant implantation within a well region of a drift layer (e.g., P-well of an N− drift region) is instead replaced with epitaxial regrowth within a formed trench, followed by planarization to achieve a device having a uniform, short channel length. Further embodiments are contemplated so as to result in an ion-implant-free self-aligned process. Moreover, the presently disclosed epitaxial regrowth embodiment are also contemplated for use in the formation of the so-called "superjunction" devices, in which a drift layer includes alternating columns of opposite polarity dopant.

Figure 1:
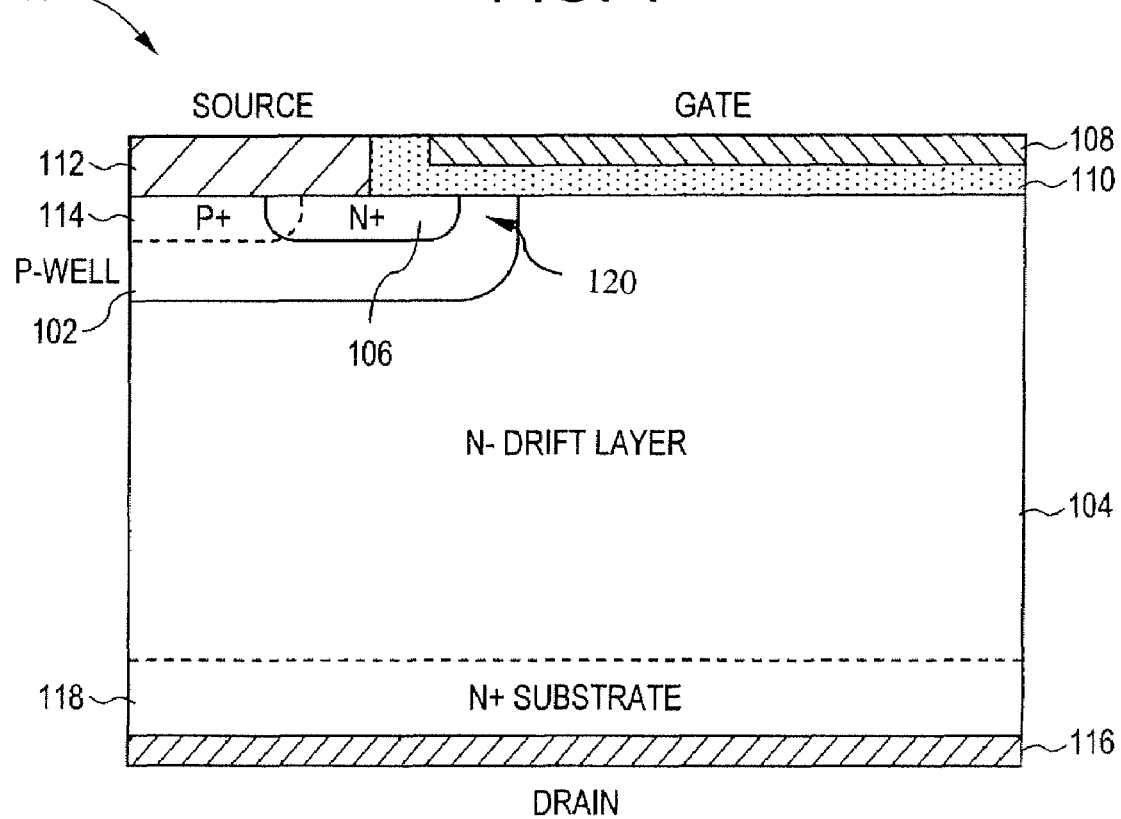
FIG. 1 is a partial cross sectional view of an N-type, SiC vertical MOSFET having a device channel defined by dopant implantation steps.

Referring initially to FIG. 1, a partial cross sectional view of an N-type, SiC vertical MOSFET cell 100 is illustrated. In an actual power MOSFET device, several of such cells 100 would be connected in parallel. As is shown in FIG. 1, the vertical MOSFET cell 100 includes a P-well region 102 formed within a top surface of an N− drift layer 104, and an N+ source region 106 formed within the P-well region 102. A gate electrode 108 is formed on a gate insulating film 110, and over a portion of the P-well region 102 interposed between the N+ source region 106 and an exposed surface portion of the N− drift layer 104. In addition, a source electrode 112 is formed in contact with the surface of both the N+ source region 106 and the P+ region 114. As shown, the P+ region 114 having a higher doping concentration than (and located at the top of the P-well region 102) enhances ohmic contact between the source electrode 112 and the P-well region 102. MOSFET 100 further includes a drain electrode 116 formed in contact with the bottom surface of an N+ drain region 118.

In operation of the vertical MOSFET 100, a positive voltage applied to the gate electrode 108 induces an inversion layer in the surface of the P-well 102 directly beneath the gate insulating film 110, such that current flows between the source electrode 112 and drain electrode 116 (via a channel region 120 and the N− drift layer 104). If the positive voltage to the gate electrode 108 is removed, the inversion layer beneath the gate insulating film 110 in the P-well 102.

As indicated above, the P-well region 102 is typically formed through implantation of the N− drift layer 104 by a suitable P-type dopant (e.g., boron, aluminum). Subsequently, the N+ source region 106 (doped by a suitable N-type dopant such as nitrogen or phosphorus) and the more greatly doped P+ region 114 are also formed within the P-well region 102 through similar dopant implantation steps. As also indicated above, however, the use of dopant implantation steps to form each of the dopant regions can result in inconsistent channel lengths, implant damage to the semiconductor or crystal lattice, and increased channel resistance.

Figure 2:
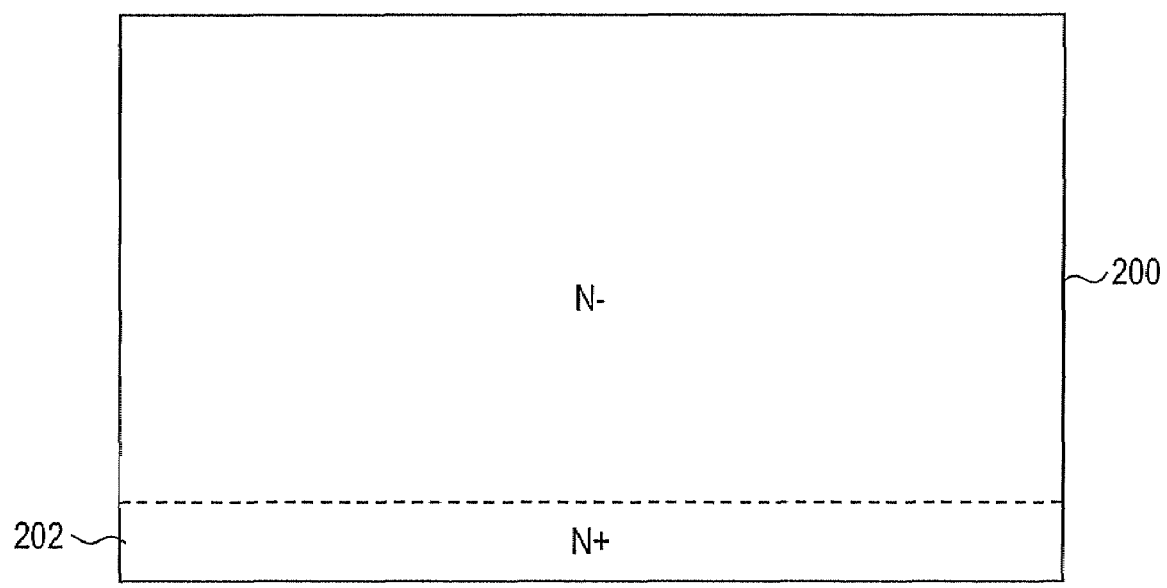
FIGS. 2 through 11 are a series process flow diagrams illustrating a method of forming a vertical MOSFET device, in accordance with an embodiment of the invention.
Figure 3:
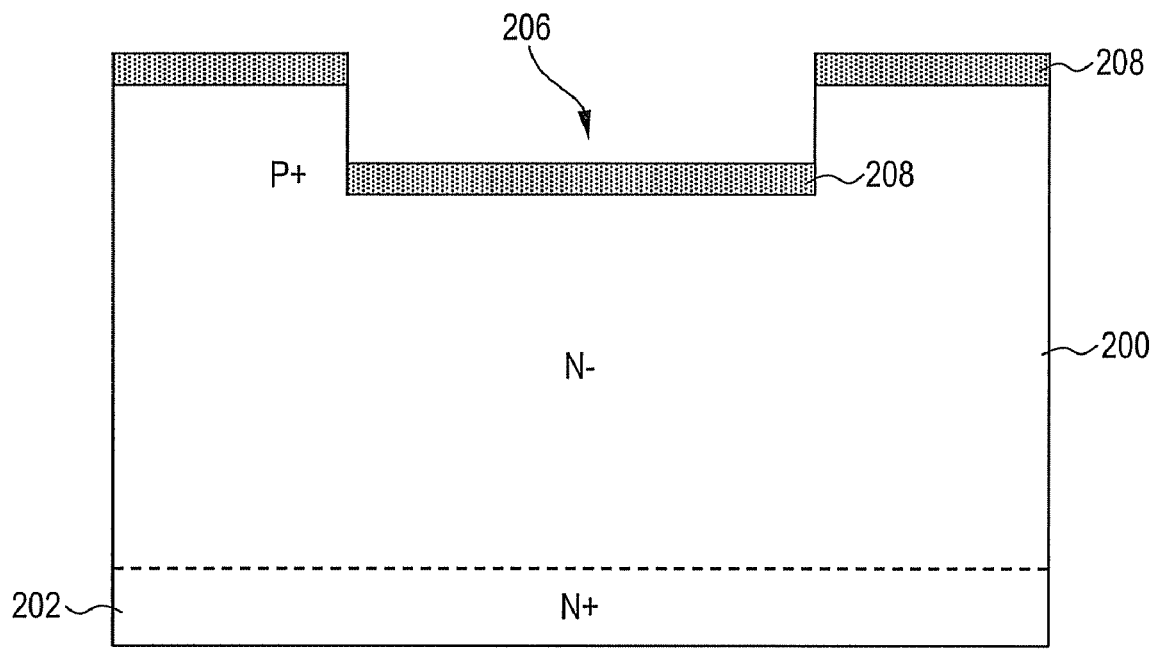

Accordingly, FIGS. 2 through 11 illustrate an exemplary process flow sequence for forming a vertical MOSFET device, in accordance with an embodiment of the invention. In FIG. 2, an N-type drift layer 200 is epitaxially grown on a N-type substrate 202 that includes an N+ drain region formed at the bottom end thereof. Then, in FIG. 3, a trench 206 is etched within the N-type drift region 200, and a P+ region 208 is formed at the bottom of the trench 206. The trench 206 generally defines the P-well region of the vertical MOSFET device. In an exemplary embodiment, the P+ region 208 may be formed by implantation of a suitable dopant material (e.g., aluminum, boron) as shown in FIG. 3. The P+ implant material 208 is also formed along the top surface of the drift layer 200 outside the trench. Alternatively, however, the P+ region 208 may also be formed through epitaxial growth (as illustrated in further detail hereinafter). It will already be noted at this point that, as opposed to the structure shown in FIG. 1, the P+ region 208 is disposed at the bottom portion of the P-well instead of at the top portion thereof.

Figure 4:
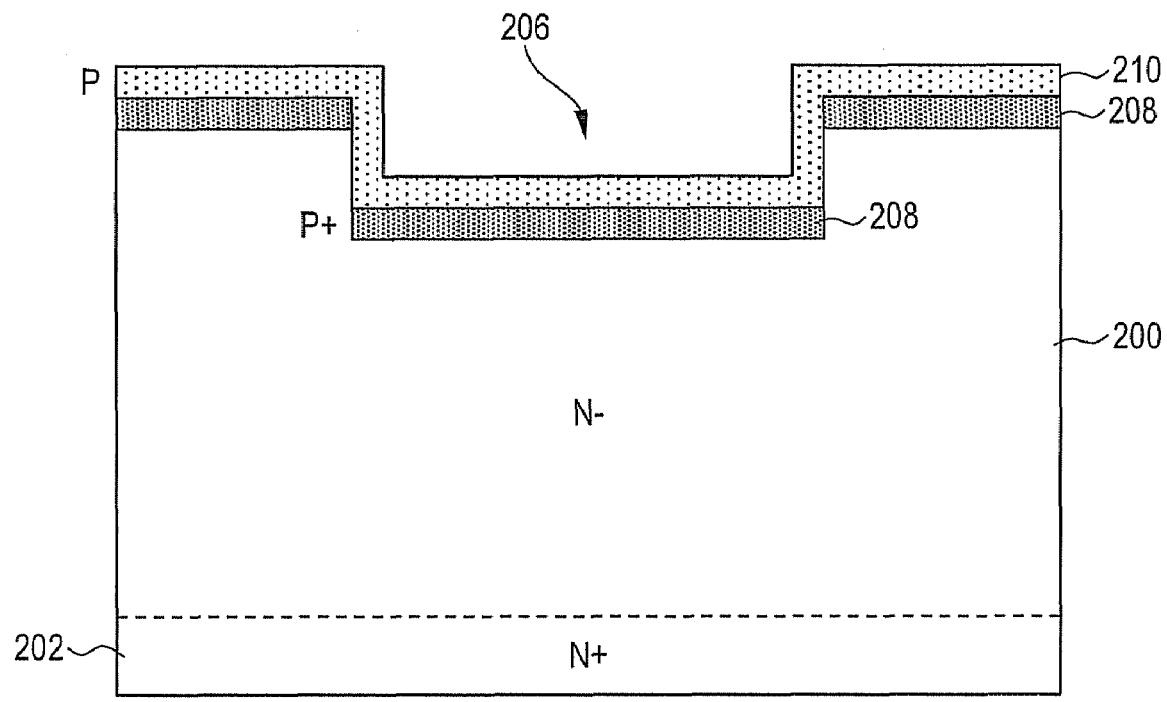

As shown in FIG. 4, a P-type layer 210 is then epitaxially grown over the entire surface of the device, including the sidewalls of the trench 206 and P+ region 208. The uniformity in thickness of the P-type layer 210 will ultimately define the channel length of the MOSFET device, since the vertical sidewall thickness of the P-type layer 210 is substantially the same as its horizontal thickness. Moreover, because the P-type layer material of the P-well region is grown (instead of being formed through ion implantation), the channel region is spared from any adverse effects of implantation.

Figure 5:
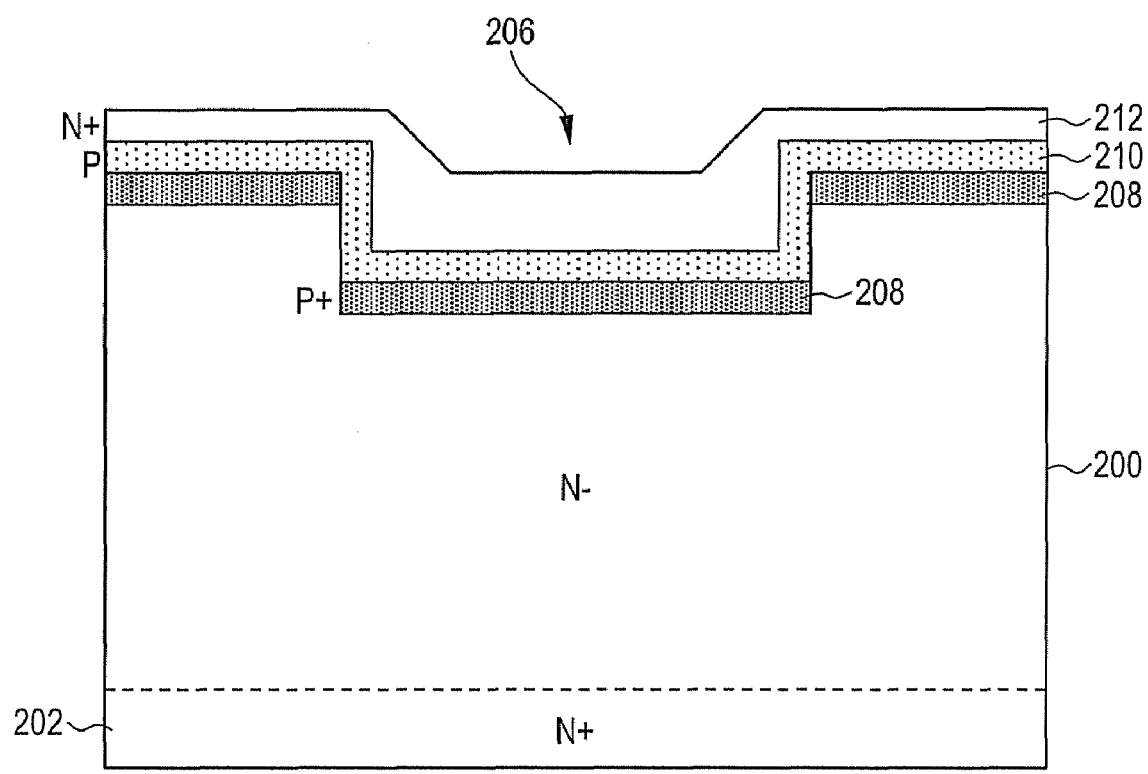
Figure 6:
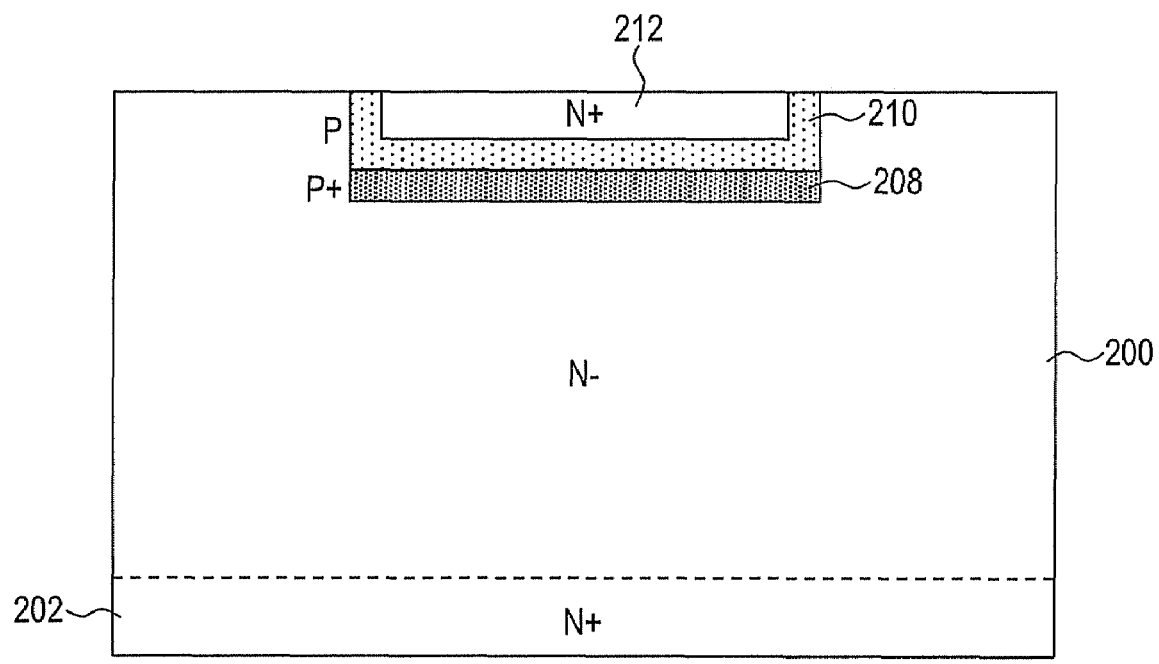

Referring now to FIG. 5, an N+ (source) layer 212 is epitaxially grown over the P-type layer 210. Once again, the epitaxial/refill approach avoids potential damage and misalignment of doped regions from multiple lithography steps. Then, in FIG. 6, the N+ layer 212 and P-type layer 210 are planarized down to the top of the trench so as to expose the N-type drift layer 200. The planarization step also removes the P+ 208 layer completely from the top surface of the drift layer 200, but without consuming the N+ layer 212. The planarization can be carried out in a single step (e.g., through chemical mechanical polishing (CMP)) or by an initial CMP step to remove topography, followed by a reactive ion etch (RIE) down to the level of the N− drift layer 200.

Figure 7:
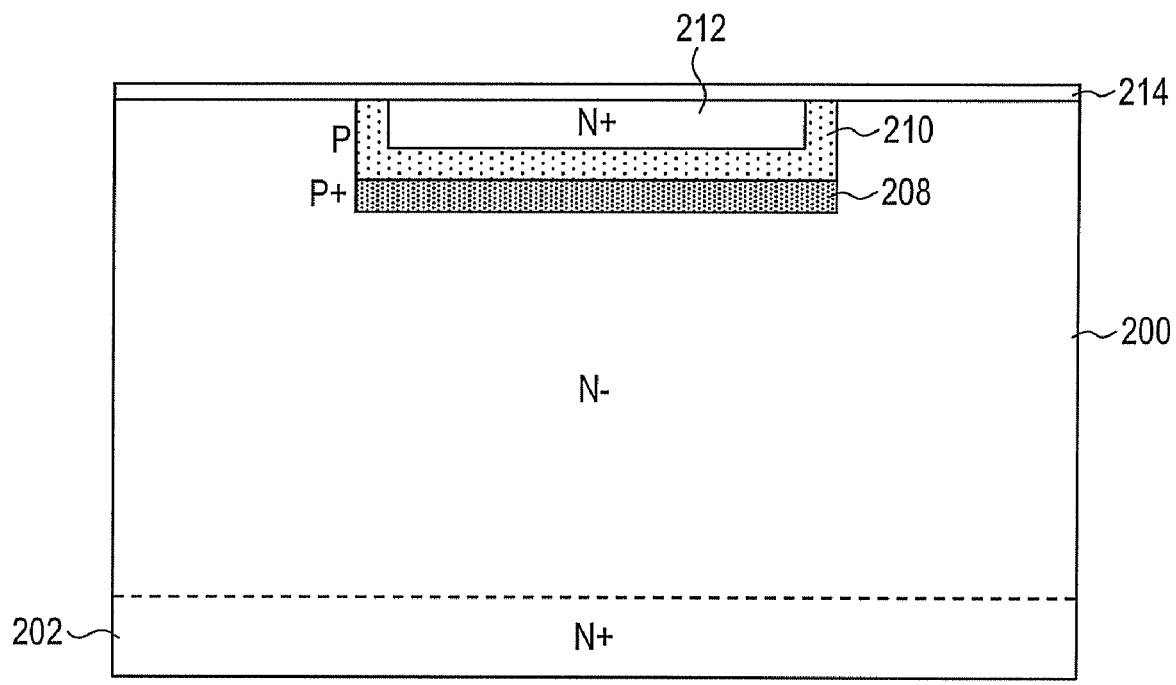
Figure 8:
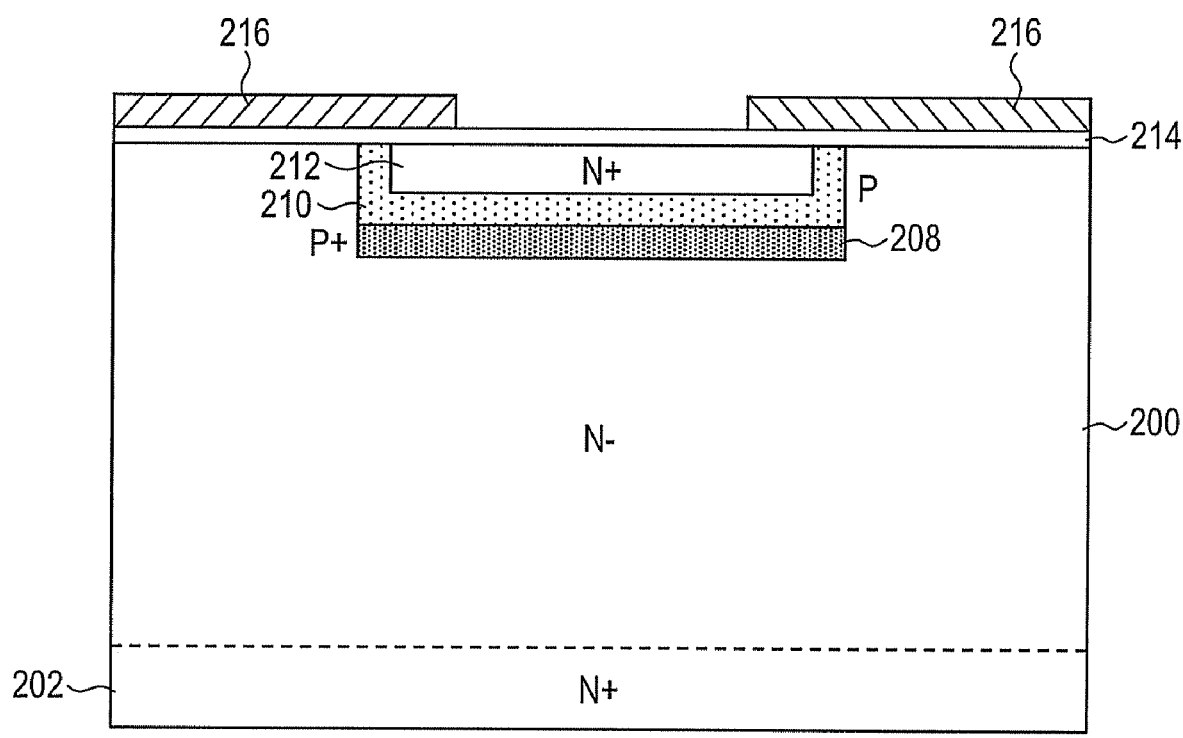
Figure 9:
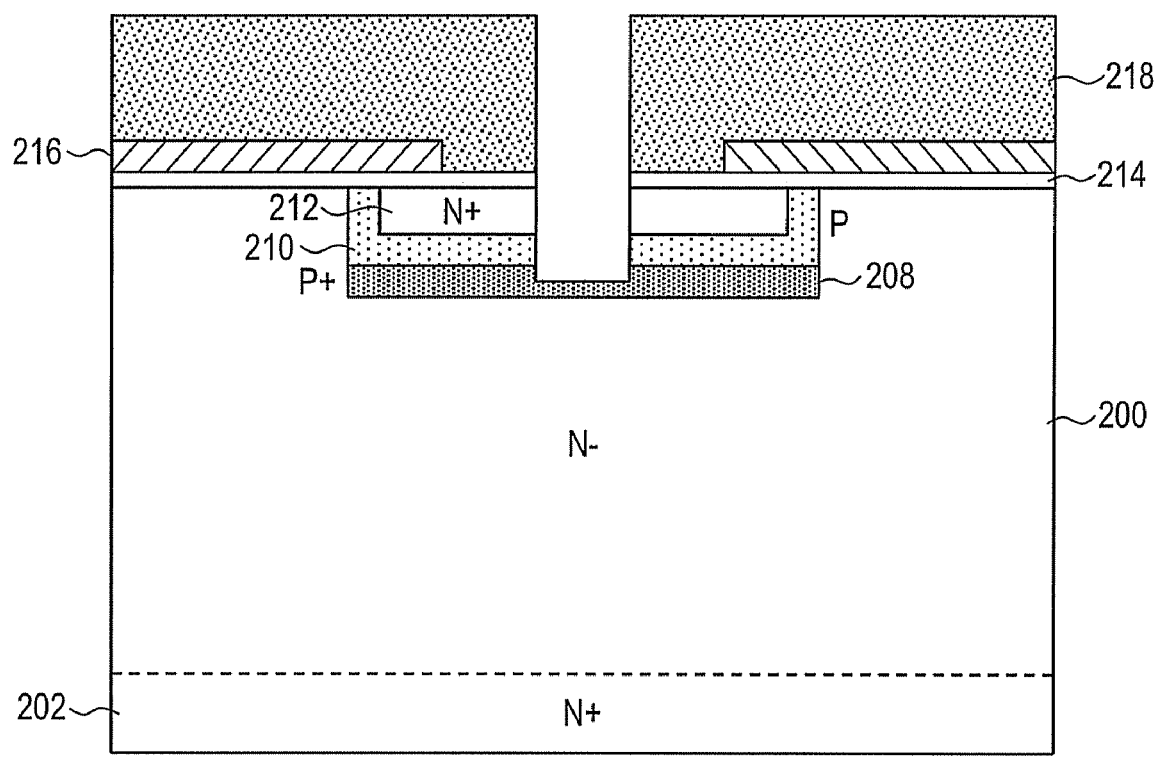

After the formation of the P-well, P+ and N+ source regions, the gate insulating and ohmic contact metal layers are formed as generally shown in FIGS. 7 through 11. For purposes of simplicity, various back end of line (BEOL) structures (e.g., dielectrics, passivation layers, overlay metal layers, etc.) are not illustrated in the figures. In FIG. 7, a gate insulating layer 214 is grown over the N− drift layer 200, P-type layer 210 and N+ layer 212, followed by the formation and patterning of a gate electrode layer 216 in FIG. 8. Then, in FIG. 9, dielectric layer 218 is patterned with a via that is etched through gate insulating layer 214, N+ layer 212 and P-type layer 210 so as to expose the P+ layer 208 at the bottom of the P-well region.

Figure 10:
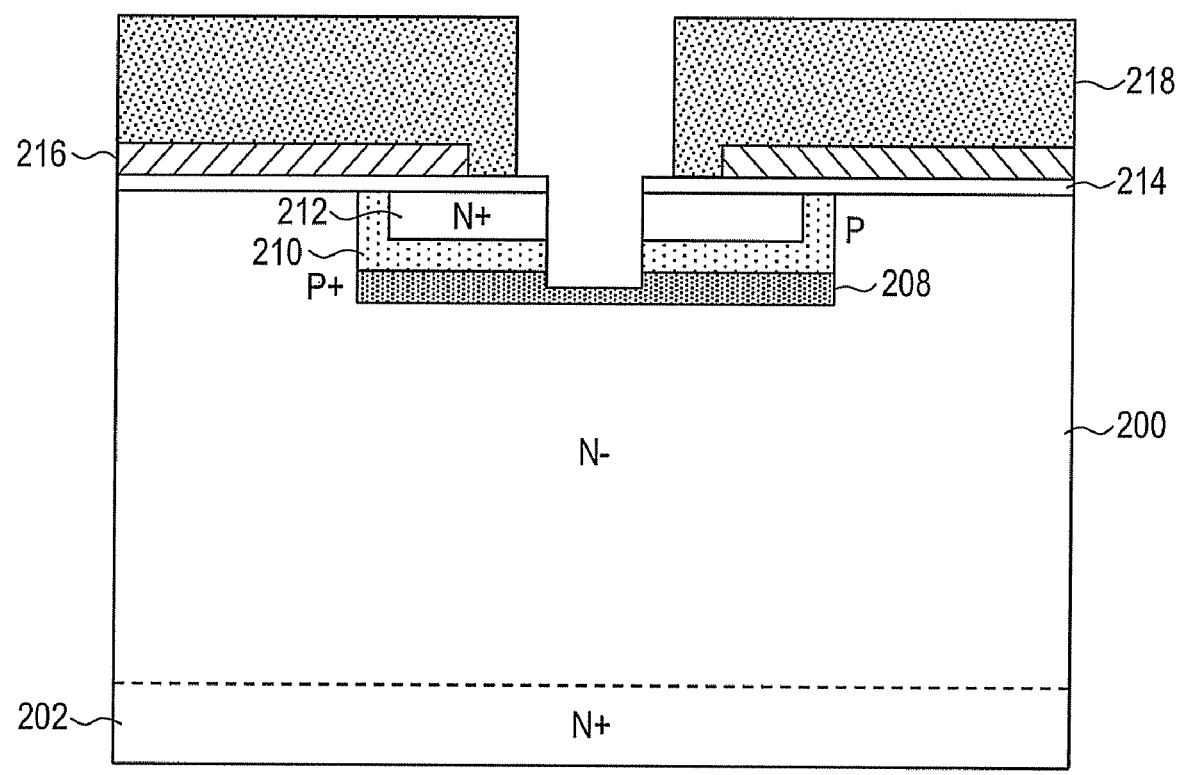
Figure 11:
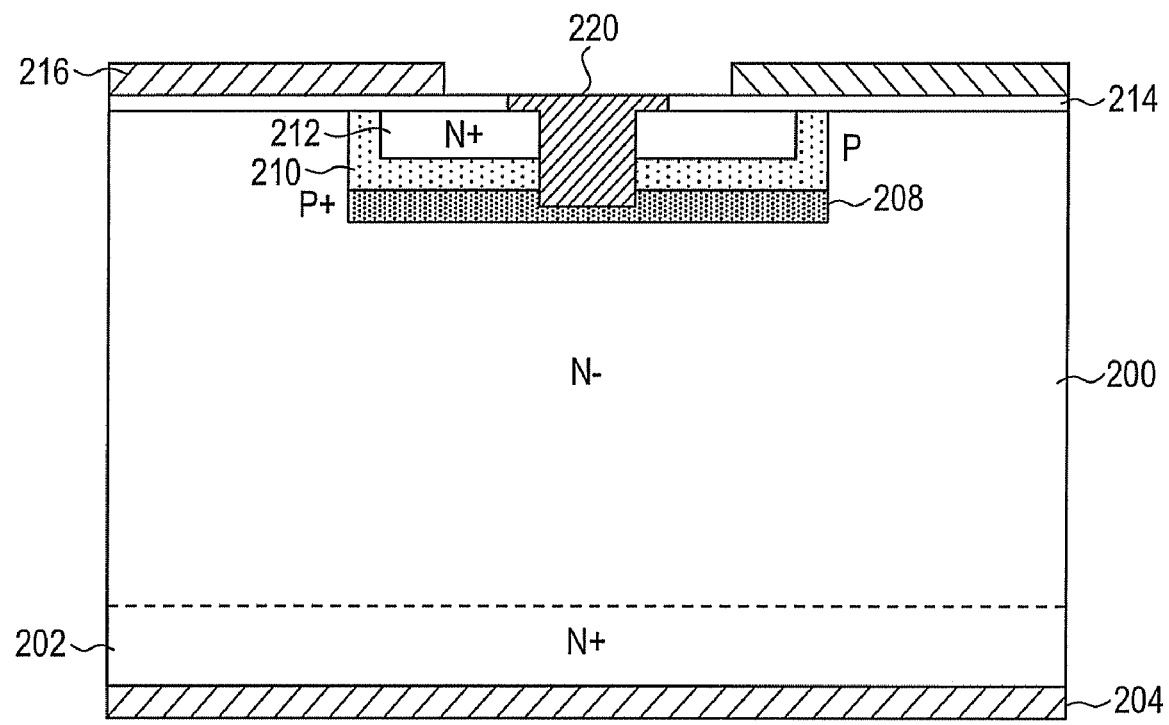

In FIG. 10, the via in dielectric layer 218 is widened so as to allow for additional removal of the gate insulating layer 214 to allow for sufficient ohmic contact between the N+ layer 212 and the P-well region. In FIG. 11, a drain electrode contact material 204 is formed at the bottom surface of the N-type substrate 202. In addition, a source electrode contact material 220 is formed within the etched portions of the P-well region, after which overlay metal and passivation layers (as is known in the art) may be formed.

Figure 13:
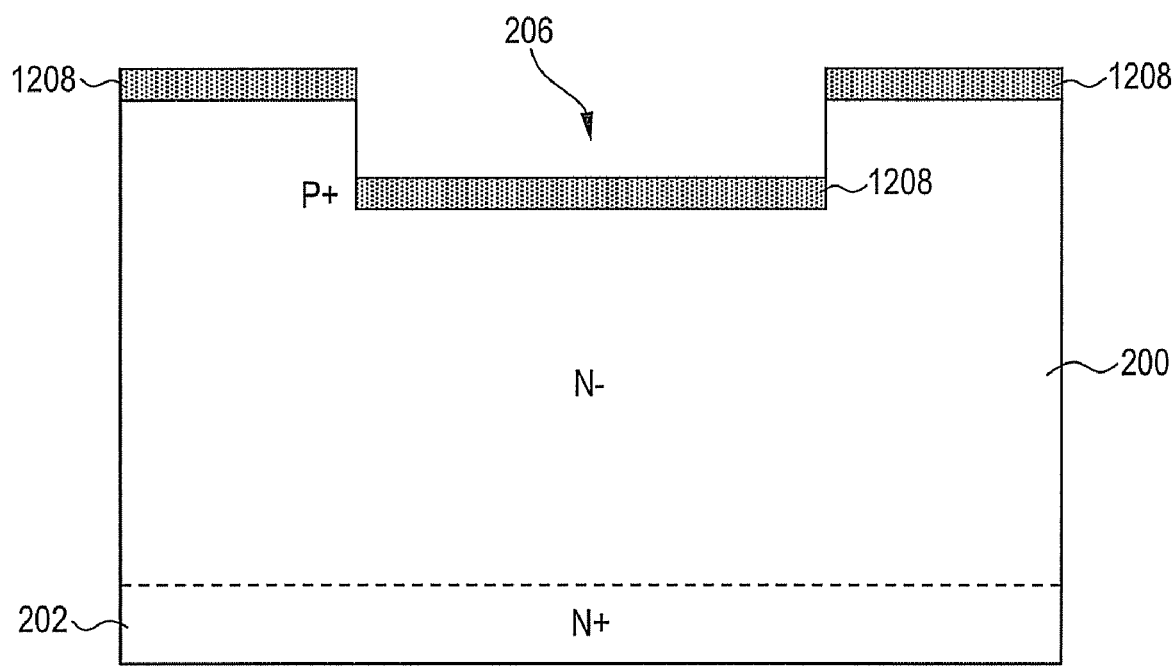
Figure 14:
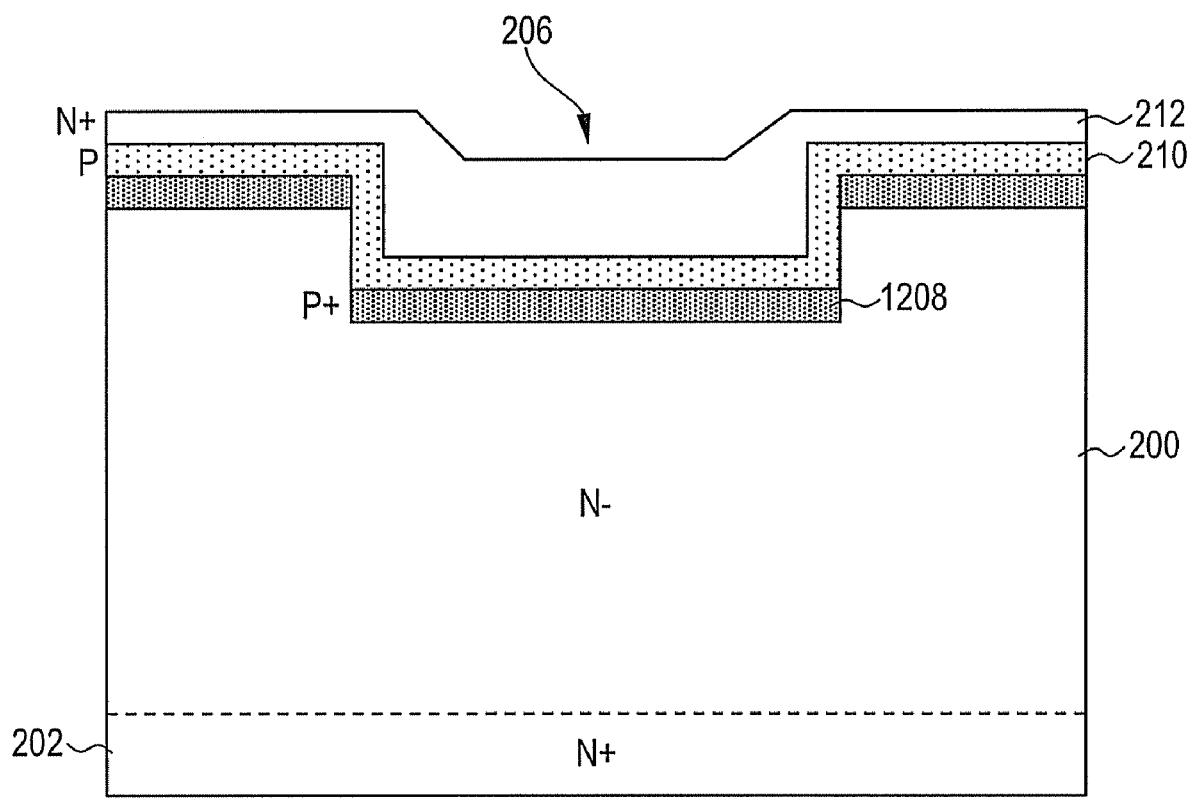

As indicated above, one variation on the formation of the P+ ohmic contact layer 208 in FIG. 3 is to grow the P+ layer epitaxially, in lieu of ion implantation. The formation of an epitaxially grown P+ layer 1208 is thus illustrated in FIG. 12. However, because the epitaxial P+ layer 1208 is conformally grown, the portions thereof on the sidewalls of the trench 206 are to be removed in order for the device to function. Thus, as shown in FIG. 13, the device is subjected to a thermal oxidation process that is anisotropic with respect to vertical surfaces. More specifically, the oxidation rate of vertical surfaces is roughly 5 times that of the horizontal surfaces. Thus, the oxidation serves to selectively "consume" the P+ layer on the sidewall in its entirety, while only consuming a small portion of the P+ layer on the planar surface. After removal of the P+ material from the trench sidewalls, the P-type layer 210 and N+ layer 212 are then epitaxially grown, as shown in FIG. 14. The device is then planarized, as shown for example in FIG. 6 discussed above.

Figure 12:
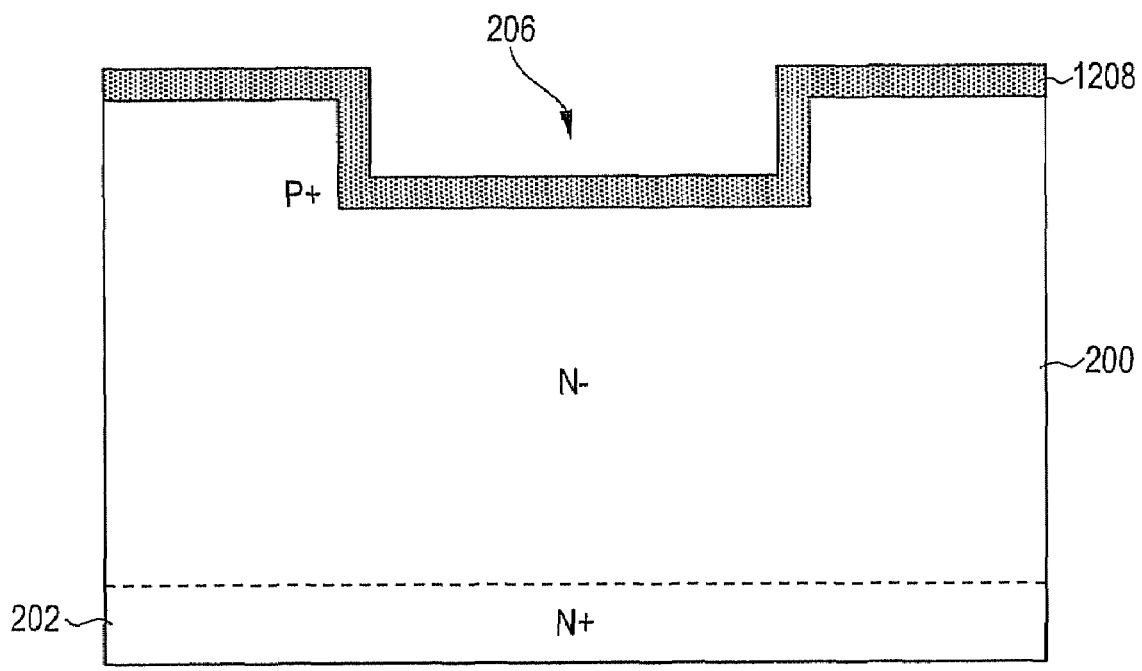
FIGS. 12 through 14 illustrate an alternative process for forming the ohmic contact region, in accordance with an alternative embodiment of the invention, in which the ohmic contact region is epitaxially grown.
Figure 15:
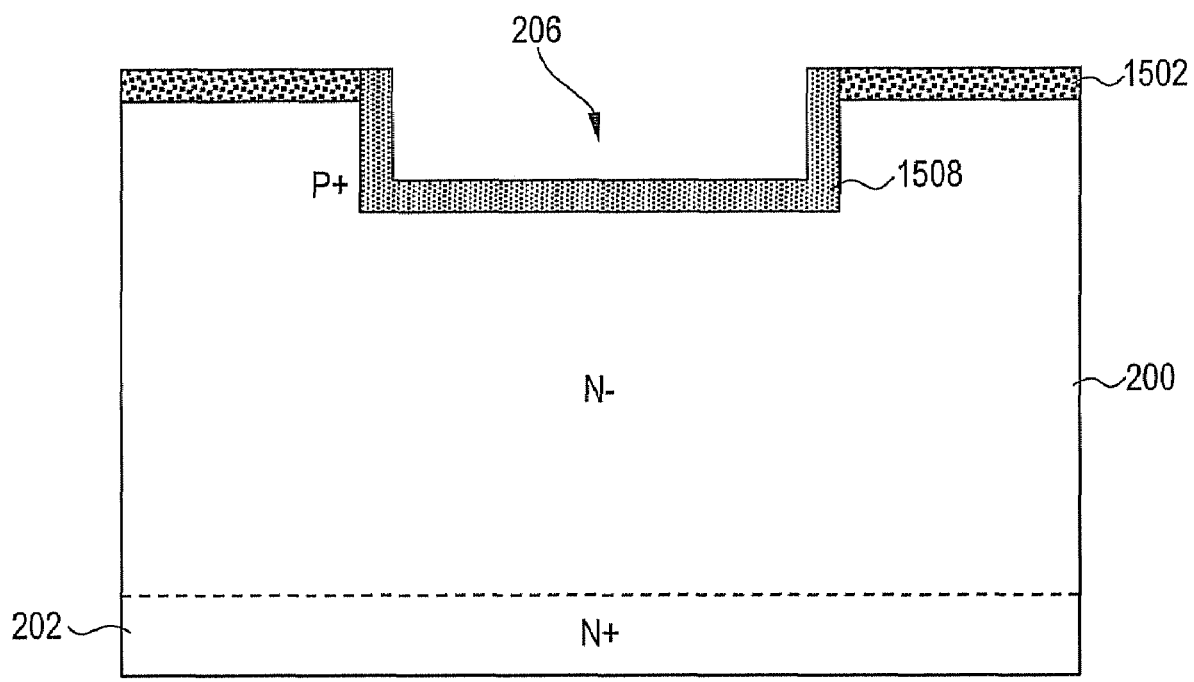
FIGS. 15 through 17 illustrate an alternative process for forming the ohmic contact region, in accordance with an alternative embodiment of the invention, in which the ohmic contact region is grown by selective epitaxy.
Figure 16:
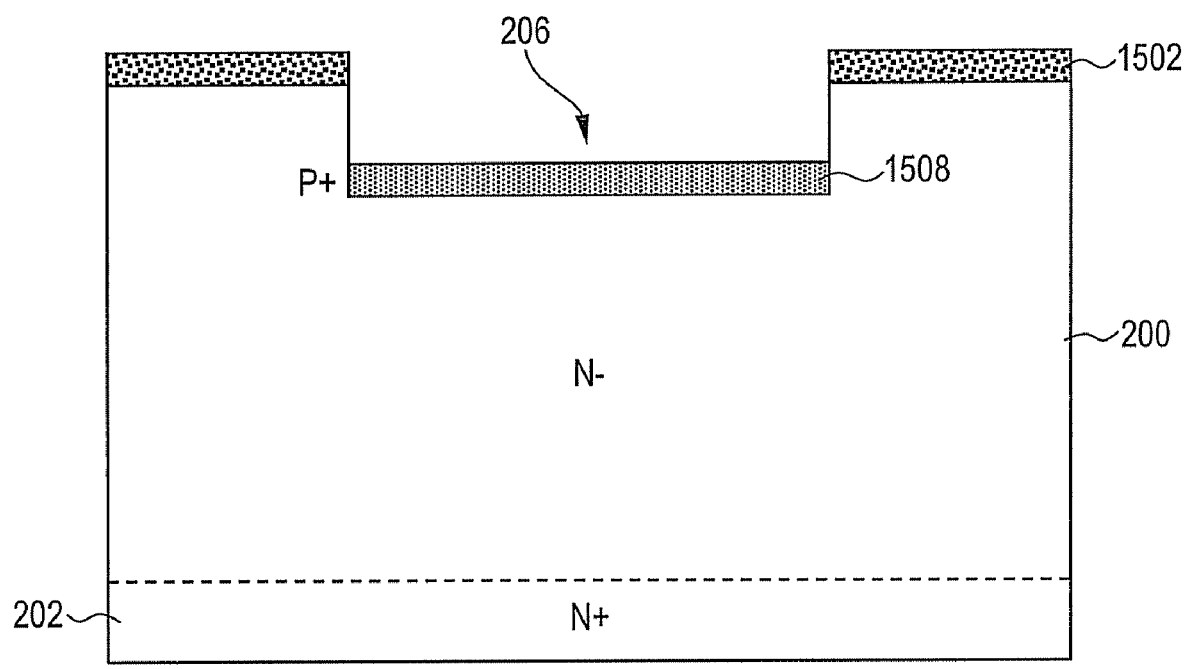
Figure 17:
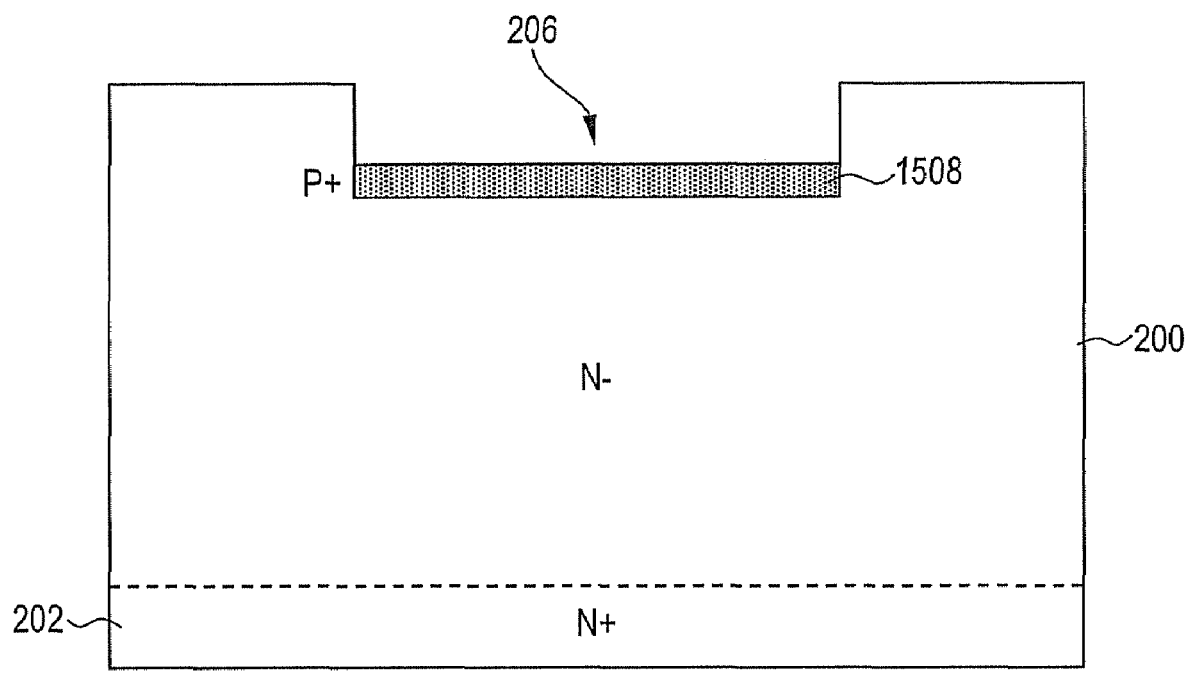

In lieu of the blanket epitaxial growth illustrated in FIG. 12, the P+ ohmic contact layer could also be selectively grown. For example, if the N– drift layer 200 is first provided with a blanket layer that blocks epitaxial growth (such as tantalum carbide, for example) prior to trench etching, the epitaxially grown layer 1508 is only formed on the sidewall surfaces of the trench 206, and not on the tantalum carbide layer 1502, as shown in FIG. 15. Once again, the portion of the P+ layer 1508 along the sidewalls of the trench would then be removed prior to P-well material formation, as shown in FIG. 16. Similar to the embodiment shown in FIG. 13, this may be implemented through a thermal oxidation process that is anisotropic with respect to vertical surfaces. Thereafter, the remaining TaC may be removed (such as through wet etching, for example) prior to further processing, as shown in FIG. 17.

Figure 18:
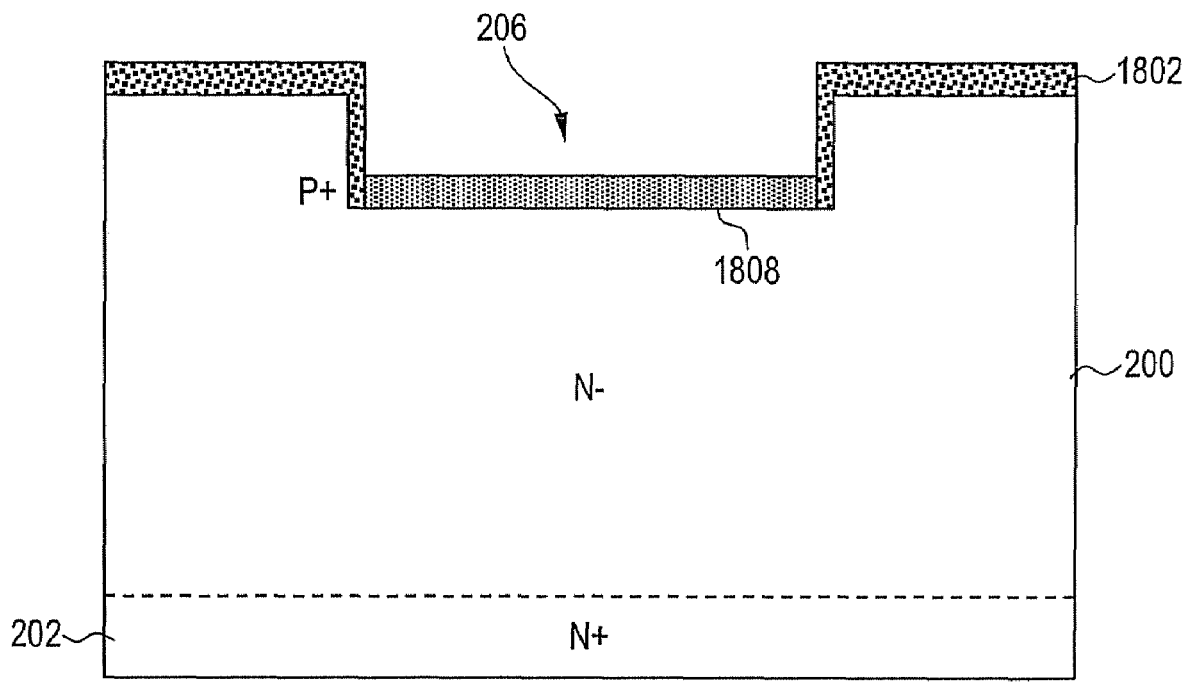
FIGS. 18 and 19 illustrate an alternative process for the selective epitaxy in FIGS. 15-17.
Figure 19:
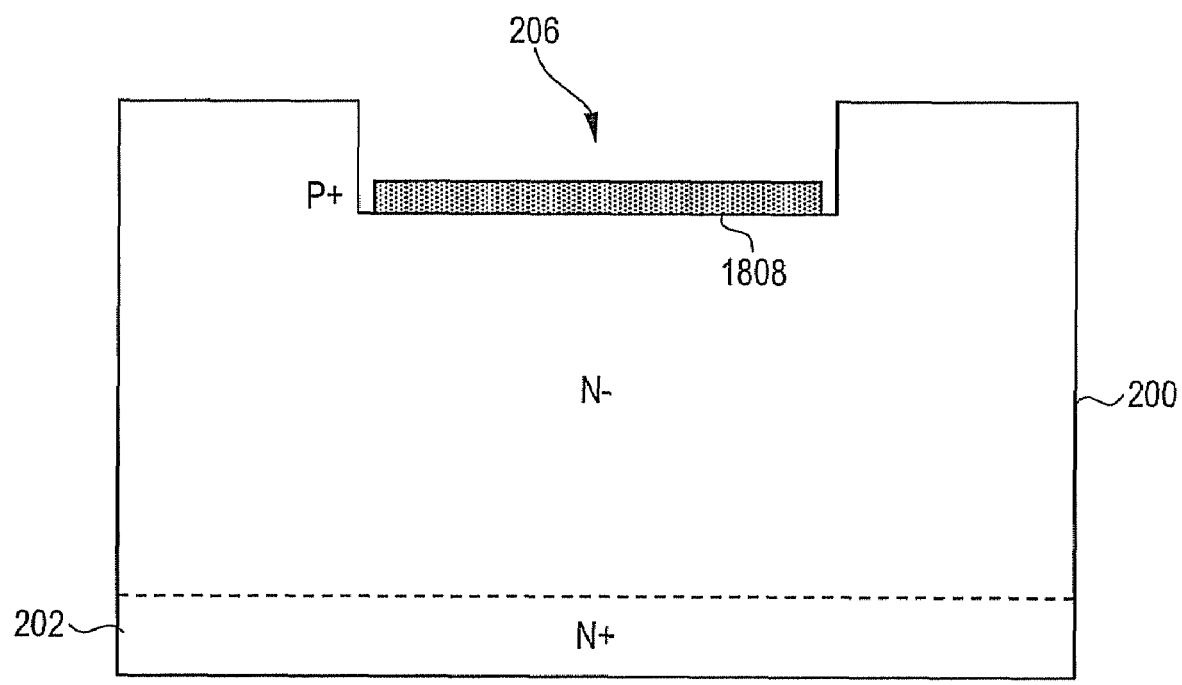
Figure 20:
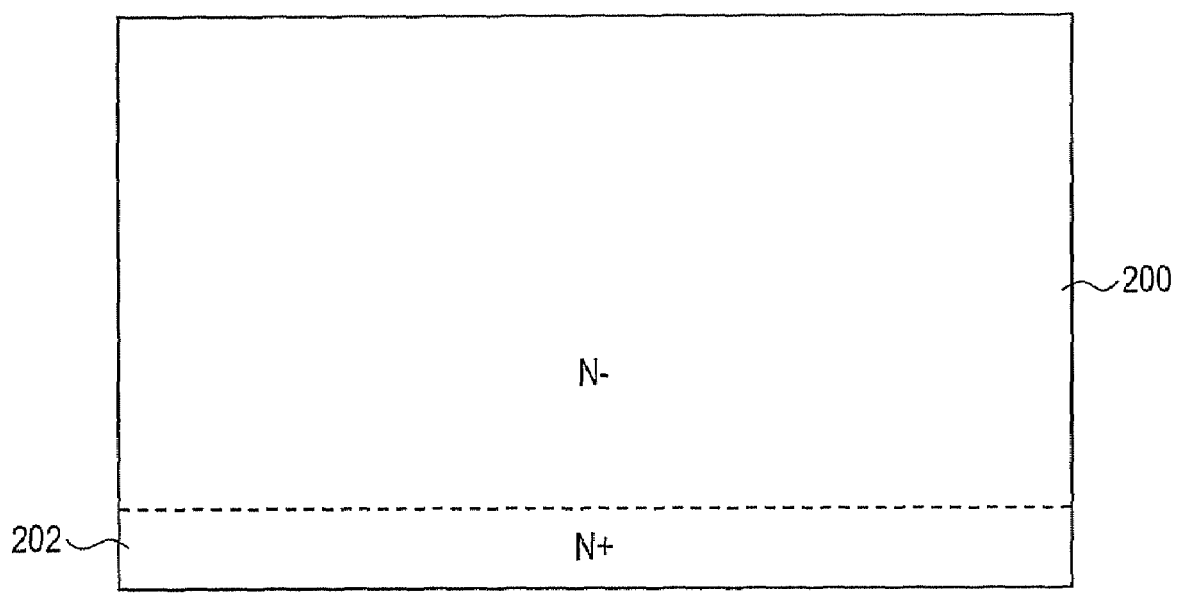
FIGS. 20 through 24 are a series of process flow diagrams illustrating a method of forming a vertical superjunction MOSFET device, in accordance with still another embodiment of the invention.

Alternatively, selective epitaxial growth can be implemented in a manner that avoids growth of the P+ layer on the trench sidewalls. As shown in FIG. 18, the tantalum carbide layer 1802 is formed on both the top surface of the drift layer 200, as well as the sidewalls of the trench 206. This may be accomplished, for example by forming an initial tantalum layer over the drift layer 200 prior to trench formation. After etching of the trench 206, a thinner film of tantalum can then be sputtered over initial tantalum layer on the top of the drift layer 200, as well as the sidewall and bottom surfaces of the trench 206. Then, through a directional etch, the thinner tantalum layer is removed from the bottom surface of the trench 206, while the thin sidewall tantalum material remains (as well as the first, thicker tantalum layer on top of the drift layer 200). Following conversion of the tantalum material to tantalum carbide at high temperature, the P+ layer 1808 is grown selectively on the bottom surface of the trench 206 in FIG. 18. The remaining tantalum carbide material is then removed, as shown in FIG. 19, and processing as described above can continue for formation of the subsequent P-type and N+ epitaxial layers. It will be noted that as a result of the small gap between the sides of the P+ layer 1808 and trench sidewalls, subsequent epitaxial growth may require polishing due to a lack of flatness.

In certain exemplary embodiments, alignment registration marks may be desirable for facilitating alignment of contacts and gate metal layers to the grown and planarized epitaxial layers. However, many of the standard processing techniques (such as metal deposition and patterning, or selective etching of registration marks, for example) may not survive the epitaxial growth conditions, implant activation annealing, or the planarization steps. Accordingly, one suitable alternative is to selectively etch trenches that are deeper than the intended regrowth/planarized regions. Such trenches will not, as a result, be completely removed by the planarization process. In the event the trench becomes "too filled" during the epitaxial regrowth process, it may be filled with a material that can block epitaxial growth, such as tantalum carbide or graphite for example.

Another alternative for creating alignment marks is to etch the alignment marks into the back surface of the wafer, and thereafter utilizing a front-to-back alignment tool. While the backside is left relatively untouched through the epitaxial and planarization processes (and thus provides a suitable alignment approach), the tolerances thereof are not as good with respect to a standard frontside alignment technique. Still another option for creating alignment marks is to mask the SiC substrate with a patterned layer that blocks epitaxial growth, and that is also easily visible. In this regard, tantalum carbide may again be a suitable material for blocking epitaxial regrowth.

The epitaxial regrowth process will cause the tantalum carbide to remain in a trench. If a dry etching based planarization is used, the tantalum carbide will act as an etch-stop layer, and will survive the planarization process. Still another technique for maintaining alignment registration marks may be to etch the SiC in the device regions, leaving pillars of protected SiC for alignment marks. If a dry-etch based planarization technique is used, these higher pillars will survive since the alignment marks are tall, while the channel regrowth areas are still relatively short.

Finally, FIGS. 20 through 24 illustrate the applicability of the above described approach of trench formation/epitaxial regrowth to SiC superjunction devices, in accordance with still a further embodiment of the invention. In a superjunction device, the tradeoff between device on-resistance and breakdown voltage as addressed by (in lieu of a homogeneous N– drift layer in an N-type device) providing the drift layer with a plurality of P-type columns beneath the P-well regions of the device. In other words, the drift layer comprises a series of regions having alternating conductivity. In so doing, the breakdown voltage of the device is increased since depletion layers extend laterally from the p-n junctions extending vertically across the drift layer in the "off" state of the device, completely depleting the drift layer.

Figure 21:
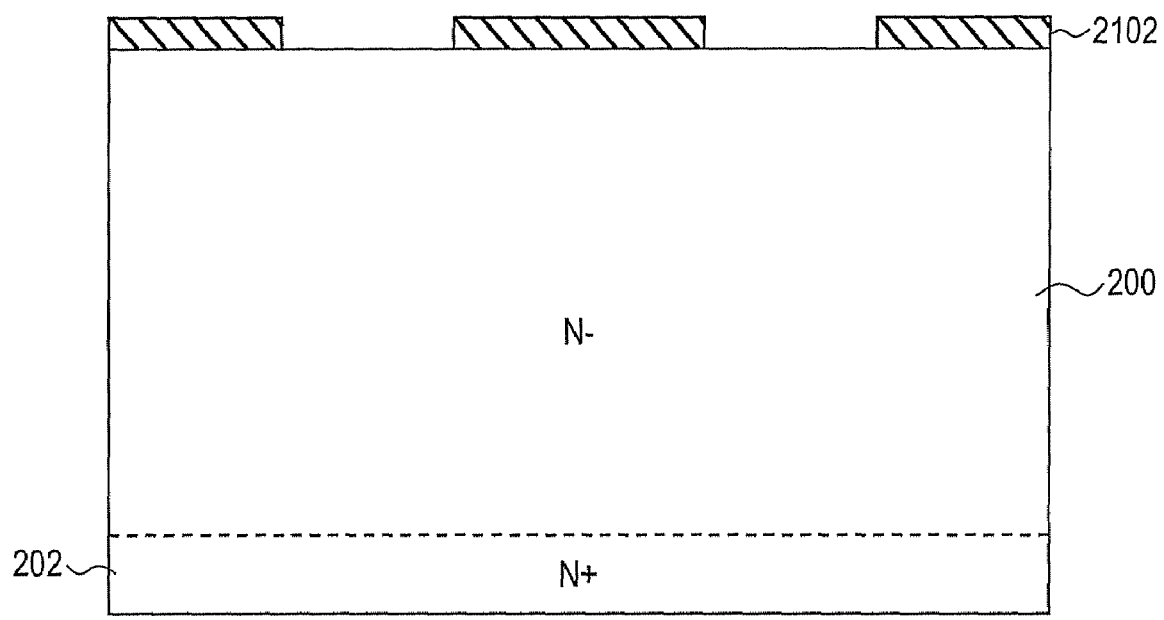
Figure 22:
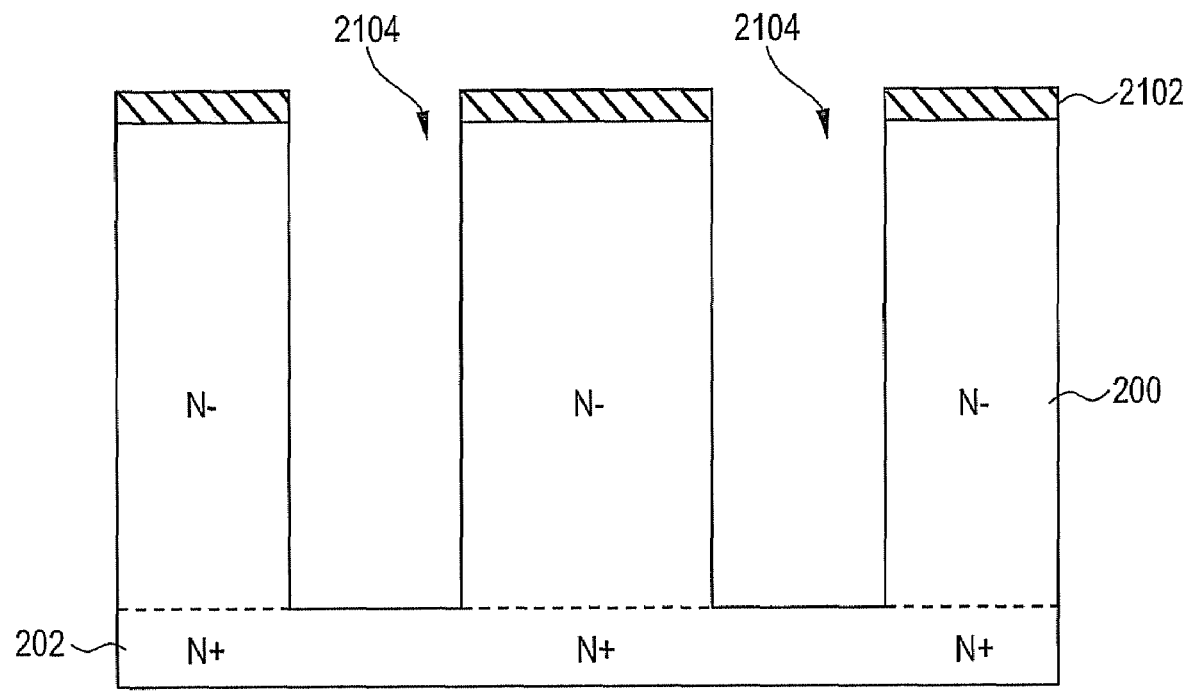
Figure 23:
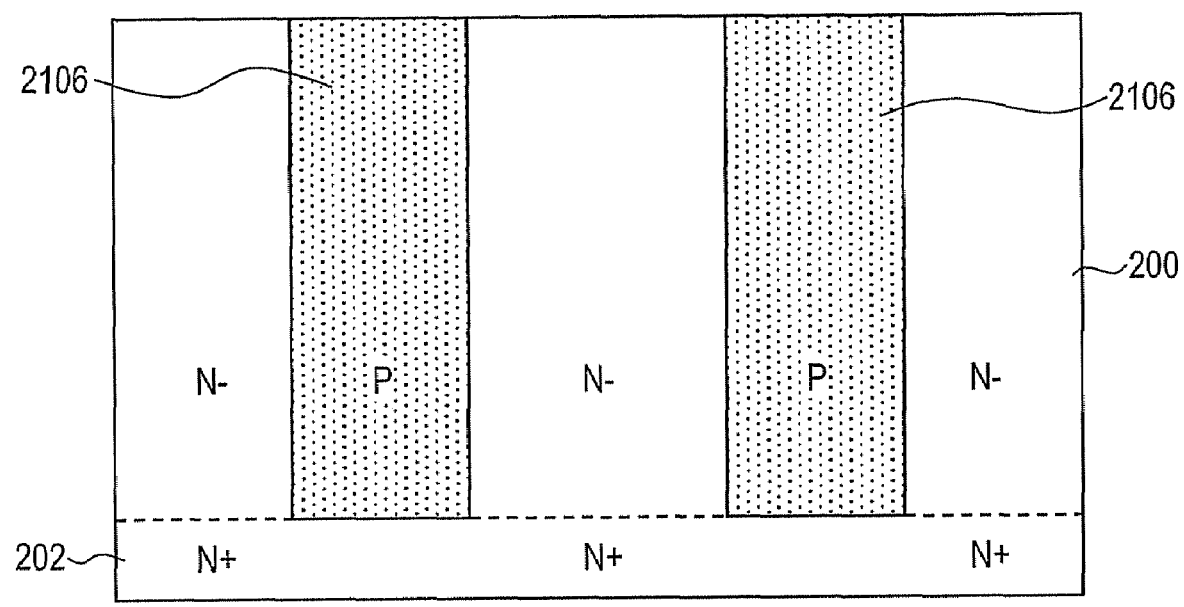
Figure 24:
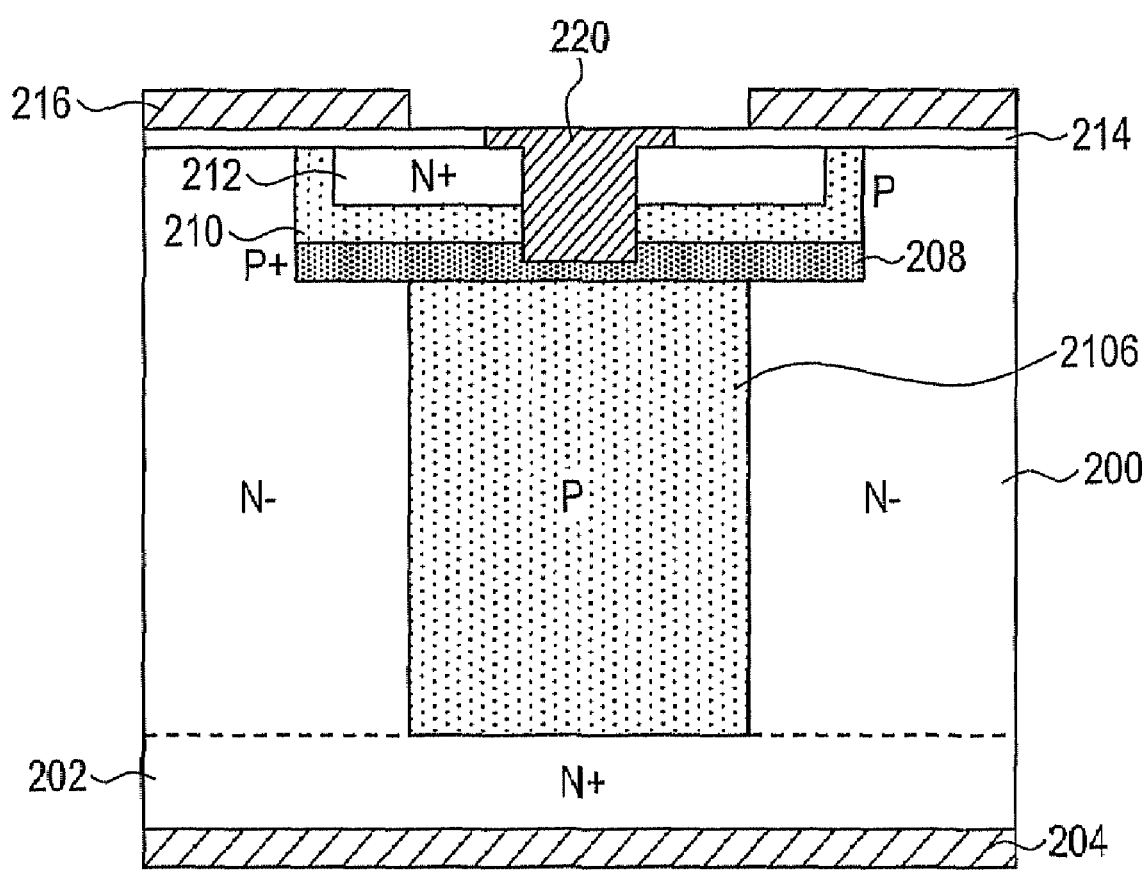

Typically, such P-type columns (for the N-type device) would be defined within the N– substrate 200 (shown in FIG. 20) through implantation. Alternatively, as shown in FIG. 21, the N– substrate 200 is patterned with a mask 2102 so as to expose portions of the substrate 200 where P-type columns are desired. Then, as shown in FIG. 22, the N– material is etched down to the level of the N+ drain region 202. The resulting "deep" trenches (e.g., about 50 to 100 μm) 2104 having a relatively high aspect ratio (e.g. about 10 to 20) are then filled with a P-type material through selective epitaxy and thereafter planarized. The superjunction drift layer having P-type columns 2106 is illustrated in FIG. 23. Once the superjunction drift layer is formed, the remaining device structures can be formed by conventional means (e.g., through implantation), or through the above described etching/epitaxial fill approach. In the case of the latter, FIG. 24 illustrates the embodiment of FIG. 11 formed using a superjunction layer as shown in FIGS. 20 through 23.

It should further be appreciated that although the exemplary embodiments of present invention are depicted in terms of vertical MOSFET devices, the epitaxial refilling technique can also be used as a substitute in the formation of other types of devices including, but not limited to: planar MOSFETs, JFETs, IGBTs, BJTs, Schottky diodes, etc. In additional, other portions of vertical devices, such as epitaxially grown body contacts and/or guard rings may be formed, thereby facilitating a completely implant free process.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method of forming a vertical MOSFET device, the method comprising:
    forming a trench within a drift layer substrate, the drift layer comprising a first polarity type, the trench generally defining a well region of a second polarity type opposite the first polarity type;
    forming an ohmic contact layer within a bottom surface of the trench, the ohmic contact layer comprising a material of the second polarity type;
    epitaxially growing a layer of the second polarity type over the drift layer, sidewall surfaces of the trench, and the ohmic contact layer;
    epitaxially growing a layer of the first polarity type over the epitaxially grown layer of the second polarity type so as to refill the trench; and
    planarizing the epitaxially grown layers of the first and second polarity type so as to expose an upper surface of the drift layer substrate.

2. The method of claim 1, wherein the ohmic contact layer is formed by ion implantation.

3. The method of claim 1, wherein the ohmic contact layer is formed by epitaxial growth.

4. The method of claim 3, further comprising:
    epitaxially growing the ohmic contact layer over the drift layer, including the sidewall and bottom surfaces of the trench; and
    selectively removing portions of the ohmic contact layer along the sidewall surfaces of the trench prior to forming the epitaxially grown layer of the second type.

5. The method of claim 4, wherein the portions of the ohmic contact layer along the sidewall surfaces of the trench are removed though oxidation.

6. The method of claim 3, wherein the ohmic contact layer is selectively formed on the sidewall and bottom surfaces of the trench, followed by removal of portions of the ohmic contact layer along the sidewall surfaces of the trench prior to forming the epitaxially grown layer of the second type.

7. The method of claim 3, wherein the ohmic contact layer is selectively formed only on the bottom surface of the trench prior to forming the epitaxially grown layer of the second type.

8. The method of claim 1, wherein the first polarity type is N-type and the second polarity type is P-type.

9. The method of claim 1, wherein the first polarity type is N-type silicon carbide and the second polarity type is P-type silicon carbide.

10. A method of forming a vertical MOSFET device, the method comprising:
    forming a drift layer over a drain region substrate, the drift layer and drain region comprising a first polarity type with the drain having a greater dopant concentration with respect to the drift layer;
    forming a trench within the drift layer, the trench generally defining a well region of a second polarity type opposite the first polarity type;
    forming an ohmic contact layer within a bottom surface of the trench, the ohmic contact layer comprising a material of the second polarity type;
    epitaxially growing a well region layer of the second polarity type over the drift layer, sidewall surfaces of the trench, and the ohmic contact layer;
    epitaxially growing a source layer of the first polarity type over the well region layer so as to refill the trench;
    planarizing the epitaxially grown source layer and well region layers so as to expose an upper surface of the drift layer;
    forming a gate insulating layer over the upper surface of the drift layer, the well region layer and the source layer;
    forming a gate electrode contact over a portion of the gate insulating layer; and
    forming a source electrode contact within the source layer, the well region layer and the ohmic contact layer.

11. The method of claim 10, wherein the ohmic contact layer is formed by ion implantation.

12. The method of claim 10, wherein the ohmic contact layer is formed by epitaxial growth.

13. The method of claim 12, further comprising:
    epitaxially growing the ohmic contact layer over the drift layer, including the sidewall and bottom surfaces of the trench; and
    selectively removing portions of the ohmic contact layer along the sidewall surfaces of the trench prior to forming the well region layer.

14. The method of claim 13, wherein the portions of the ohmic contact layer along the sidewall surfaces of the trench are removed though oxidation.

15. The method of claim 12, wherein the ohmic contact layer is selectively formed on the sidewall and bottom surfaces of the trench, followed by removal of portions of the ohmic contact layer along the sidewall surfaces of the trench prior to forming the well region layer.

16. The method of claim 12, wherein the ohmic contact layer is selectively formed only on the bottom surface of the trench prior to forming the well region layer.

17. The method of claim 10, wherein the first polarity type is N-type and the second polarity type is P-type.

18. The method of claim 10, wherein the first polarity type is N-type silicon carbide and the second polarity type is P-type silicon carbide.

19. The method of claim 10, further comprising:
    prior to forming the trench in the drift layer comprising the well region, forming a plurality of deep trenches within the drift layer, extending down to the top of the drain region substrate; and
    filling the deep trenches with a material of the second polarity type though epitaxial growth therein, so as to form a superjunction drift layer.

* * * * *

UNITED STATES PATENT AND TRADEMARK OFFICE
CERTIFICATE OF CORRECTION

PATENT NO. : 7,595,241 B2  Page 1 of 1
APPLICATION NO. : 11/466488
DATED : September 29, 2009
INVENTOR(S) : Matocha et al.

It is certified that error appears in the above-identified patent and that said Letters Patent is hereby corrected as shown below:

In Column 3, Line 58, delete "102." and insert -- 102 disappears --, therefor.

In Column 7, Line 48, in Claim 5, delete "though" and insert -- through --, therefor.

In Column 8, Line 40, in Claim 14, delete "though" and insert -- through --, therefor.

In Column 8, Line 60, in Claim 19, delete "though" and insert -- through --, therefor.

Signed and Sealed this

Second Day of March, 2010

David J. Kappos
*Director of the United States Patent and Trademark Office*

UNITED STATES PATENT AND TRADEMARK OFFICE
CERTIFICATE OF CORRECTION

PATENT NO. : 7,595,241 B2  Page 1 of 1
APPLICATION NO. : 11/466488
DATED : September 29, 2009
INVENTOR(S) : Matocha et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 381 days.

Signed and Sealed this

Twenty-eighth Day of September, 2010

David J. Kappos
*Director of the United States Patent and Trademark Office*